United States Patent
Murto (10) Patent No.: US 6,356,026 B1
(45) Date of Patent: Mar. 12, 2002

(54) ION IMPLANT SOURCE WITH MULTIPLE INDIRECTLY-HEATED ELECTRON SOURCES

(75) Inventor: Robert W. Murto, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/666,168

(22) Filed: Sep. 21, 2000

Related U.S. Application Data (60) Provisional application No. 60/167,373, filed on Nov. 24, 1999.

(51) Int. Cl.[7] .................................................. H01J 7/24
(52) U.S. Cl. .............................. 315/111.81; 315/111.51; 315/111.21; 250/426; 250/427
(58) Field of Search ....................... 315/111.81, 111.21, 315/111.31, 111.51, 111.71; 250/426, 427, 423 R, 492.21, 424

(56) References Cited

U.S. PATENT DOCUMENTS

| 4,361,762 A | * | 11/1982 | Douglas ..................... 250/251 |
| 5,497,006 A | * | 3/1996 | Sferlazzo et al. ........... 250/427 |
| 5,517,084 A | * | 5/1996 | Leung .................... 315/111.81 |

* cited by examiner

*Primary Examiner*—Haissa Philogene
(74) *Attorney, Agent, or Firm*—Jacqueline J. Garner; W. James Brady III; Frederick J. Telecky, Jr.

(57) ABSTRACT

An ion implanting architecture (60). The architecture comprises an arc chamber (64) having an interior area (64$i$). The architecture also comprises a plurality of electron sources (66, 68) disposed at least partially within the interior area. Each of the plurality of sources comprises a conductive plate (72, 80) operable to emit electrons into the interior area and a heating element (70, 78) for transferring heat to the conductive plate.

22 Claims, 4 Drawing Sheets

ION IMPLANT SOURCE WITH MULTIPLE INDIRECTLY-HEATED ELECTRON SOURCES

This application claims priority under 35 USC § 119(e)(1) of provisional application No. 60/167,373 filed Nov. 24, 1999.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to integrated circuit formation, and are more particularly directed to an ion source architecture for providing ion implantation to form integrated circuits.

Integrated circuits are immensely prevalent in all aspects of contemporary electronic technology. Indeed, vast resources are expended in developing and implementing integrated circuit technology in order to supply demands imposed by the consuming marketplace. In this regard, the efficient production of integrated circuits is critical, and the present embodiments are directed at such efficiency. Particularly, the present embodiments improve the efficiency for building integrated circuits on a wafer or the like by improving the efficiency of the ion source architecture for providing ion implantation to the wafer. This as well as other benefits are explored later, but are first preceded by a discussion of the prior art.

Figure 1:
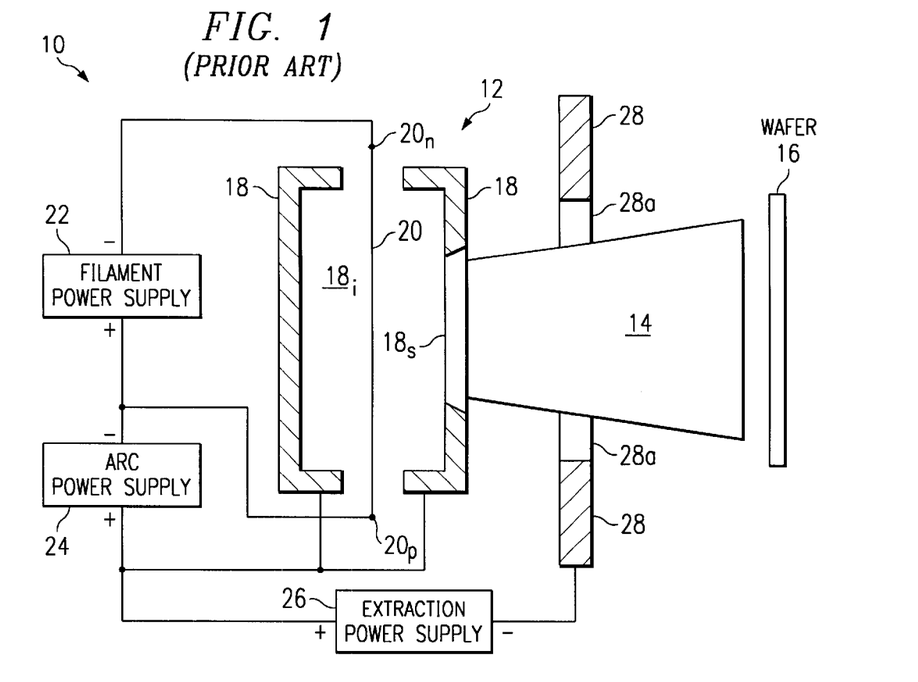
FIG. 1 illustrates a general view of a prior art ion source architecture having an ion source with a filament passing through the center of the arc chamber.

By way of introduction, FIG. 1 illustrates a general view of various components of a prior art ion source architecture 10. Architecture 10 may include other components and could be illustrated and presented in still greater detail, but the illustration as shown and discussion below should be satisfactory to present one skilled in the art with a sufficient understanding of the prior art and for purposes of better appreciating the preferred embodiments discussed later. Turning to architecture 10, it includes an ion source 12 which includes various components described below, and as detailed below where during operation an ion beam 14 is extracted from source 12 so that ions are directed toward and implanted into an integrated circuit wafer 16. Looking in greater detail, ion source 12 includes an arc chamber 18 which has an interior area 18i for ion activity described below, and which includes an arc slit 18s which is an aperture through which ions may exit interior area 18i in the form of ion beam 14. Disposed through open ends of arc chamber 18 and through interior area 18i is a filament 20. Filament 20 at its ends 20p and 20n is connected to the positive and negative terminals, respectively, of a filament power supply 22. An arc power supply 24 has its negative terminal connected to the positive terminal of filament power supply 22 and its positive terminal connected to arc chamber 18. A positive terminal of an extraction power supply 26 is connected to the positive terminal of arc power supply 24, and the negative terminal of an extraction power supply 26 is connected to an extraction electrode 28 shown vertically in FIG. 1, and which includes an aperture 28a through which ion beam 14 may pass as further detailed below.

The operation of architecture 10 is now explored. Each of power supplies 22, 24, and 26 is energized, while wafer 16 is set at a potential which is low relative to that imposed on arc chamber 18 (e.g., wafer 16 may be set at ground or treated as a ground plane). The energizing of filament power supply 22 applies a potential across filament 20 which thereby causes filament 20 to heat; this heat is of a sufficient intensity so that electrons are emitted away from filament 20 into interior area 18i. In addition, the energizing of arc power supply 24 imposes a voltage on arc chamber 18 that is positive relative to that on filament 20 to thereby influence the direction of the electrons emitted by filament 20, primarily in an effort to maintain a heavy concentration of those electrons near the center of interior area 18i. Still further, one or more gases is typically provided into interior area 18i, although the apparatus for providing such gas is not shown in FIG. 1. In any event, the resultant electron and gas combination is often referred to in the art as a plasma, with its constituent parts also being referred to as ions. Magnets (not shown) are used to increase the electron mean free path further enhancing plasma generation. Lastly, the energizing of extraction power supply 26 imposes a voltage on extraction electrode 28 that is negative relative to that imposed on arc chamber 18, thereby attracting positive ions outward of slit 18s and producing a positive charged ion beam 14. Ion beam 14 passes through aperture 28a and impacts the surface of wafer 16, thereby implanting ions from beam 14 into wafer 16. Lastly, it is also known in the art to use one or more magnets (not shown) so as to divert some of the ion types away from wafer 16 so that only the remaining desired ions impact and thereby implant within wafer 16.

While architecture 10 has been successful for implanting ions in wafers, it also has various drawbacks. For example, recall that filament 20 passes through the center of interior area 18i, and also that it is desirable to maintain a heavy concentration of electrons near the center of interior area 18i. The resulting concentration of plasma at the center of interior area 18i tends to gradually wear filament 20 and, indeed, it is known that filament 20 will eventually fail (e.g., break), typically in response to this plasma exposure. This failure prohibits further use of architecture 10 until a satisfactory repair is made and, thus, there may be considerable down time in the operation of architecture 10. Such down time is considerably expensive when demand is to keep architecture 10 operating on a full-time basis, as is often the case in contemporary semiconductor fabrication facilities. As another disadvantage, the use of filament 20 as a single filament may have limitations on the amount of ion concentration it is capable of producing.

Figure 2:
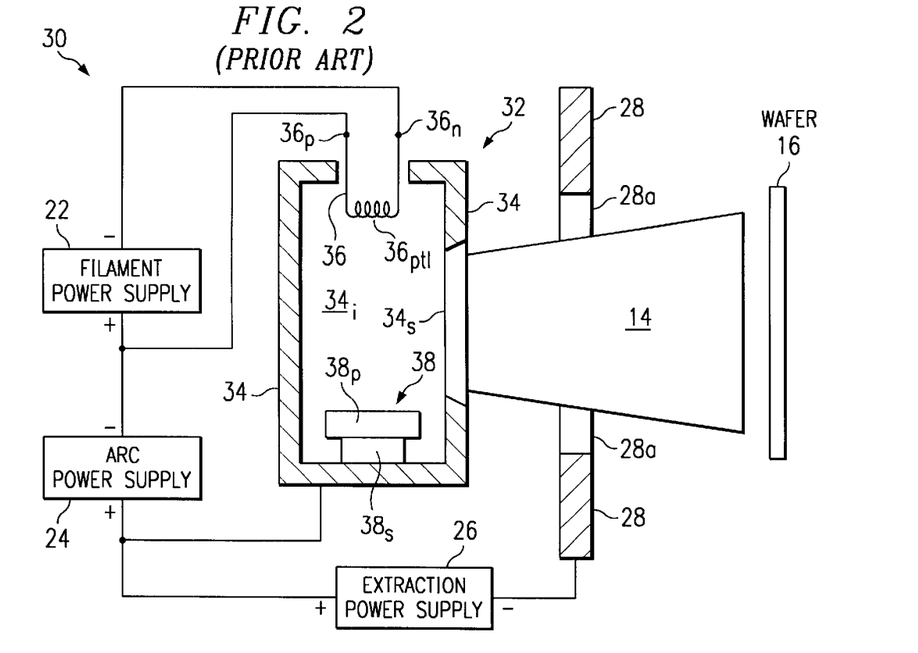
FIG. 2 illustrates a general view of a prior art ion source architecture having an ion source with a filament having a pigtail portion within the interior of the arc chamber and a reflector disposed at an opposite end of the arc chamber.

By way of further background, FIG. 2 illustrates an alternative prior art ion source architecture 30. To simplify this and the remaining prior art illustrations, some of the components in architecture 30 are the same as those shown with respect to architecture 10 of FIG. 1; as a result, these components and their reference numbers are carried forward from FIG. 1 and the reader is assumed familiar with the earlier discussion of such components. Looking then to the other components in architecture 30, it includes an ion source 32, which is sometimes referred to in the art as a Bernas source. Ion source 32 includes an arc chamber 34 which has an interior area 34i for ion activity and an arc slit 34s which through which ions may exit interior area 34i (as ion beam 14). Located proximate a first opening at a first end of arc chamber 34 is a filament 36, where filament 36 has a length 36ptl in the shape of a pigtail and which exists within interior area 34i, and where filament 36 further has ends 36p and 36n connected to the positive and negative terminals, respectively, of filament power supply 22. Located at a second end of arc chamber 34 is a reflector 38, where for reasons discussed below it should be noted that reflector 38 is therefore at an opposite end of arc chamber 34 relative to the location of filament 36. Reflector 38 includes a reflecting plate 38$p$ which is typically a metal material, and plate 38$p$ is supported by a support 38$s$ which is an insulating material so as to electrically isolate plate 38$p$ from arc chamber 34.

The operation of architecture 30 is similar in various respects to that of architecture 10, namely, in architecture 30 each of power supplies 22, 24, and 26 is energized and wafer 16 is set at a potential which is low relative to that imposed on arc chamber 34. In response, filament 36 heats and pigtail 36$ptl$ emits electrons into interior area 34$i$, and these electrons are further directed toward the center of interior area 34$i$ due to the electrical bias imposed on arc chamber 34 and additional source magnets (not shown). Once more, these electrons may be combined with one or more gases in interior area 34$i$ to create a plasma from which ion beam 14 may be extracted. In addition, however, for architecture 30 reflector 38 also influences the directionality of the electrons in interior area 34. Particularly, when electrons are initially emitted by pigtail 36$ptl$ and toward reflector plate 38$p$, plate 38$p$ accumulates a negative charge. Thereafter, as additional electrons are emitted in the same manner, they are reflected away from plate 38$p$ and again toward the center of interior area 34$i$. As a result, the concentration of electrons and, thus, the ion plasma density at the center of interior area 34$i$, is enhanced.

From the above, one skilled in the art will appreciate that architecture 30 also has been successful for implanting ions in wafers, but it too has various drawbacks. For example, filament 36, both in the portion forming pigtail 36$ptl$ and a smaller portion that extends toward ends 36$p$ and 36$n$, also is physically in contact with the plasma formed in interior area 34$i$ and, once more, therefore this layout deteriorates the integrity of filament 36 such that it eventually fails in response to this contact. The deterioration may be improved as compared to architecture 10 since filament 36 does not extend to the absolute center of interior area 34$i$, but nonetheless the direct exposure of filament 36 to the plasma will cause an ultimate failure of filament 36. As with prior art architecture 10, such a break prohibits further use of architecture 30 until a satisfactory repair is achieved, thereby presenting the expense and other burdens associated with a considerable down time in the operation of architecture 30.

Figure 3:
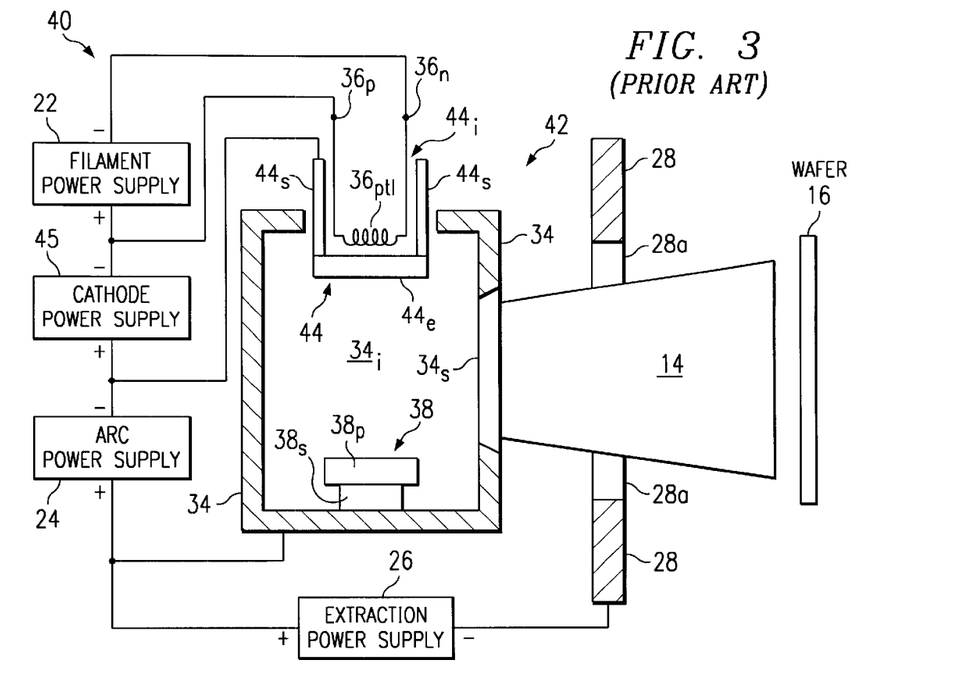
FIG. 3 illustrates a general view of a prior art ion source architecture having an ion source with a filament having a pigtail portion encased within a cathode that extends within the interior of the arc chamber, and further includes a reflector disposed at an opposite end of the arc chamber.

As still further background, FIG. 3 illustrates an alternative prior art ion source architecture 40. Architecture 40 includes an ion source 42 which is sometimes referred to in the art as an indirectly-heated cathode source for reasons more clear. With one exception, architecture 40 is the same as architecture 30 and, thus, for simplicity the common components and their reference numbers are carried forward from FIG. 2 to FIG. 3, with the reader being assumed familiar with the earlier discussion of such components. Looking to the one difference between architectures 40 and 30, filament 36 in ion source 42 is protected from interior area 34$i$ by a cathode 44. Thus, filament 36 may extend into interior area 34$i$, but to the extent that it does so it is encased within the interior 44$i$ defined by cathode 44. Typically, cathode 44 has a metallic end 44$e$, and its sides 44$s$ are insulated from arc chamber 34 either by forming them from an insulating material or by separating cathode 44 from arc chamber 34 with air (i.e., by permitting a space between arc chamber 34 and cathode 44). The operational description below provides further insight as to the reasons for choosing such materials and the desirability of this insulating effect Lastly in connection with power to cathode 44, cathode 44 is biased by a positive terminal of a cathode power supply 45, where that positive terminal is also connected to the negative terminal of arc power supply 24. The negative terminal of cathode power supply 45 is connected to the positive terminal of filament power supply 22.

The operation of architecture 40 is similar in various respects to that of architecture 30 in that, once again, each of power supplies 22, 24, and 26 is energized, wafer 16 is set at a potential which is low relative to that imposed on arc chamber 34, filament 36 heats, and an ion beam 14 is extracted toward wafer 16. More particularly, however, for architecture 40 the heating of filament 36 transfers heat to cathode 44 and, thus, cathode 44 emits electrons. In this manner, therefore, the heat from filament 36 indirectly causes the emission of electrons into interior area 34$i$, thereby giving rise to the earlier-introduced "indirectly-heated" identifier used in the art with respect to ion source 42. In any event, these indirectly generated electrons proceed in the same manner as described above and, thus, are directed toward the center of interior area 34$i$ due to the operation of reflector 38 as well as the bias on arc chamber 34 and the source magnets (not shown).

Architecture 40 provides an improvement over architectures 10 and 30, but it also provides drawbacks. Turning first to the improvement, filament 36 is not exposed directly to the plasma within interior 34$i$ because filament 36 is encased within cathode 44. Thus, the encasing effect of cathode 44 around filament 36 initially protects filament 36 from the plasma-created deterioration described above with respect to architectures 10 and 30. However, cathode 44 is itself exposed to the plasma; as a result, and as a drawback of architecture 40, at some point an aperture or other passage will form within cathode 44 and filament 36 is then exposed to the plasma. Accordingly, eventually filament 36 also will fail and, at that time, architecture 40 requires down time for repair.

Figure 4:
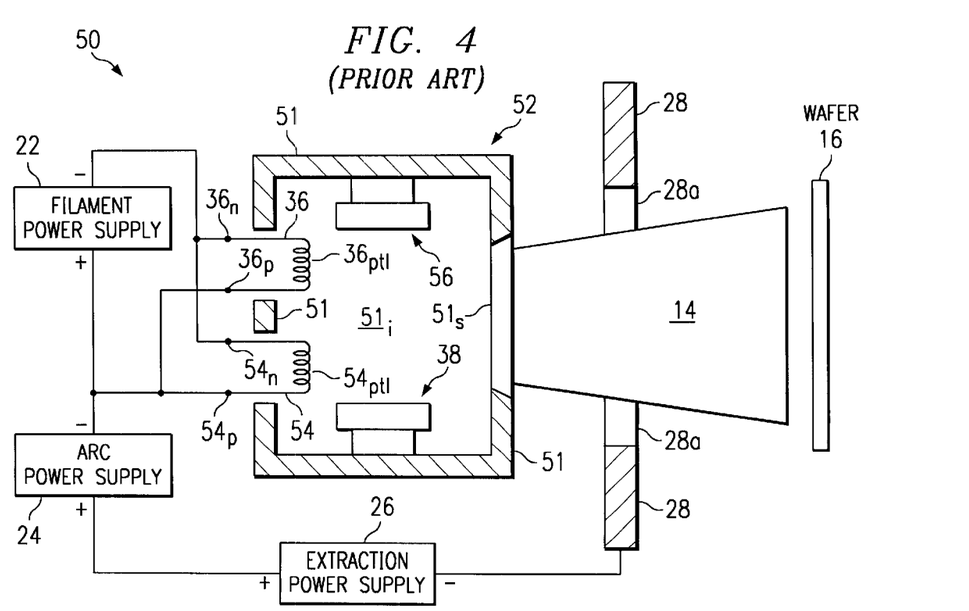
FIG. 4 illustrates a general view of a prior art ion source architecture having an ion source with two filaments disposed along a side of the arc chamber, where each filament has a pigtail portion within the interior of the arc chamber, and further includes a pair of reflectors disposed at opposite ends of the arc chamber.

As a final example, FIG. 4 illustrates an alternative prior art ion source architecture 50. Architecture 50 includes an ion source 52 which is sometimes referred to in the art as a double Bernas source since ion source 52 doubles the interior elements of the Bernas ion source 32 shown in FIG. 2. Thus, in addition to those elements shown in FIG. 2 (and carried forward into FIG. 4), an arc chamber 51 has an ion source 52 which includes a second filament 54 having a pigtail 54$ptl$ and a second reflector 56, where these devices are formed in the same manner as filament 36 and reflector 38, respectively, discussed above in FIG. 2. The positioning of these devices differ, however, in that reflectors 38 and 56 are at opposing ends of arc chamber 51 while filaments 36 and 54 are in the same side of arc chamber 51 and they also are on the opposite side of arc chamber 34 as compared to the side in which arc slit 51$s$ is formed. Lastly, note that filaments 36 and 54 are electrically connected in parallel to filament power supply 22.

The operation of architecture 50 is quite similar to that of architecture 30, with the example of a duplicate effect provided by using dual filaments and dual reflectors. Thus, once the power and potentials as described above relative to FIG. 2 are provided, each of filaments 36 and 54 emits electrons into interior area 51$i$, and those electrons are further directed toward the center of interior area 51$i$ due to the electrical bias imposed on arc chamber 51 as well as the reflective action of reflectors 38 and 56 and the source magnets (not shown). Once more, these electrons may be combined with one or more gases in interior area 51$i$ to create a final plasma from which ion beam 14 may be extracted.

Architecture 50 provides both improvements and drawbacks relative to various of the architectures described above. As an improvement, the use of dual filaments 36 and 54 improves the plasma density that may be achieved within interior area 51*i* of architecture 50. As a result, higher beam currents are associated with ion beam 14 of architecture 50. However, note that the drawbacks of architecture 50 are similar to those of architecture 30. For example, each of filaments 36 and 54 extends within interior area 51*i* and, thus, each filament is unprotected from the plasma and will wear as a result of such exposure. Indeed, this aspect may be more troublesome when there is reliance on dual components. In other words, the benefit of the dual filaments is lost if either one of filaments 36 or 54 fail and, thus, to the extent that both are needed then architecture 50 is limited in operation until the first failure of either filament, at which time the other filament may be effectively useless because ion source 52 will require down time to service at least the first-failed filament.

In view of the above, there arises a need to address the drawbacks of the prior art and to provide an improved integrated circuit ion source architecture, as is achieved by the preferred embodiments discussed below.

BRIEF SUMMARY OF THE INVENTION

In the preferred embodiment, there is an ion implanting architecture. The architecture comprises an arc chamber having an interior area. The architecture also comprises a plurality of electron sources disposed at least partially within the interior area. Each of the plurality of electron sources comprises a conductive plate operable to emit electrons into the interior area and a heating element for transferring heat to the conductive plate. Other circuits, systems, and methods are also disclosed and claimed.

DETAILED DESCRIPTION OF THE INVENTION

FIGS. 1 through 4 were discussed earlier in the Background Of The Invention section of this document and the reader is assumed familiar with such discussion.

Figure 5:
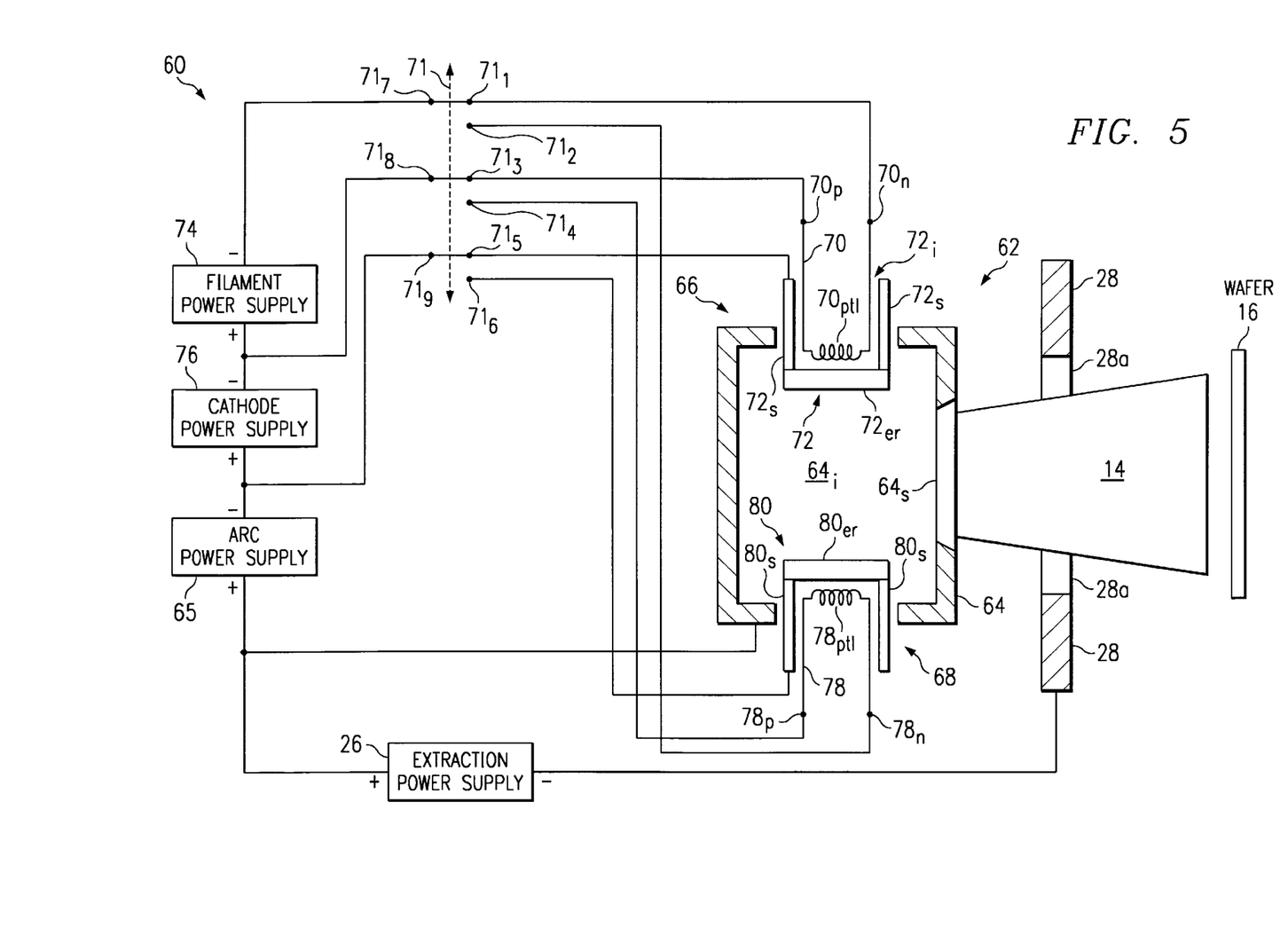
FIG. 5 illustrates a general view of a first inventive ion source architecture having an ion source with two electron source assemblies, where each assembly is alternately operable to emit electrons or reflect electrons based on the configuration of a switch connected between the assemblies and a single set of power supplies.

FIG. 5 illustrates a first inventive ion source architecture 60. As in the case of the architectures described above, note that architecture 60 may include other components and could be illustrated and presented in greater detail; however, the illustration as shown and discussion below should be satisfactory to present one skilled in the art with a sufficient understanding of the preferred embodiments. Turning to architecture 60, it includes an ion source 62 which, using a different apparatus and methodology than the prior art, also permits extraction of ion beam 14 through an aperture 28*a* of extraction plate 28 and toward an integrated circuit wafer 16. Looking in greater detail, ion source 62 includes an arc chamber 64 formed using a conductive material and which is electrically connected to a positive terminal of an arc power supply 65. Arc chamber 64 has an interior area 64*i* for ion activity and an arc slit 64*s* which is an aperture through which ions may exit interior area 64*i* in the form of ion beam 14. At opposing ends of arc chamber 64 are structurally identical indirectly-heated ion source assemblies 66 and 68, where the structure and functionality of such assemblies differs from the prior art in various respects as detailed below. Briefly noting some of the distinctions, each of assemblies 66 and 68 is operable to perform a dual functionality not provided by the prior art, the preferred orientation of assemblies 66 and 68 differs from the prior art, and the electrical connections of assemblies 66 and 68 differs from the prior art. Each of these differences will be apparent by the conclusion of the remaining discussion of the structure and operation of architecture 60.

Looking now in more detail to assembly 66, it includes a filament 70 having ends 70*p* and 70*n* which are connected to terminals $71_1$ and $71_3$, respectively, of a switch 71. Filament 70 also preferably includes a pigtail portion 70*ptl*. Filament 70 is encased relative to interior area 64*i* by a cathode 72, that is, filament 70 in disposed within interior 72*i* of cathode 72. Thus, cathode 72 may be shaped in the form of a hollow container with an open end to receive filament 70 and a closed end toward interior area 64*i*, or in some other configuration whereby cathode 72 protects filament 70 from exposure to the plasma formed within interior area 64*i*. Cathode 72 includes an emitter/reflector portion 72*er* as well as insulating sides 72*s*. In the preferred embodiment, emitter/reflector portion 72*er* is formed by a conductor, such as a metal. Also in the preferred embodiment, insulating sides 72*s* are formed using an electrical insulator, although sides 72*s* also may be metal or some other conducting material so long as there is a gap or some other insulating mechanism between arc chamber 64 and emitter/reflector portion 72*er*. Further, cathode 72 is electrically connected to a terminal $71_5$ of switch 71. In this regard, terminal $71_5$ is shown generally connected to side 72*s* of cathode 72; however, it should be understood that if side 72*s* is an insulator, the connection is sufficient to provide a potential to emitter/reflector portion 72*er*, such as by a separate conductor (not shown).

Having introduced some of the connections relative to assembly 66 and switch 71, the remaing connections relative to those devices are now explored. Switch 71 further includes three terminals $71_7$, $71_8$, and $71_9$ that are connected to power supplied included in architecture 60. More particularly, terminal $71_7$ is connected to the negative terminal of a filament power supply 74; accordingly, when switch 71 is in its upward position as shown in FIG. 5, then end 70n of filament 70 is electrically connected, via switch 71, to the negative terminal of filament power supply 74. Similarly, terminal $71_8$ is connected to the positive terminal of filament power supply 74 (and also to the negative terminal of a cathode power supply 76); accordingly, when switch 71 is in its upward position as shown in FIG. 5, then end 70p of filament 70 is electrically connected, via switch 71, to the positive terminal of filament power supply 74. Terminal $71_9$ is connected to the positive terminal of cathode power supply 76, and also to the negative terminal of arc power supply 65; accordingly, when switch 71 is in its upward position as shown in FIG. 5, then cathode 72 is electrically connected, via switch 71, to the positive terminal of cathode power supply 76 (and to the negative terminal of arc power supply 65). Finally, note that switch 71 includes three floating terminals $71_2$, $71_4$, and $71_6$, that is, each of these terminals is not connected to a load or power supply. Thus, and for reasons more clear below, when switch 71 is in its downward position, assembly 66 is not connected to either filament power supply 74 or cathode power supply 76.

Assembly 68, as mentioned above, is structurally identical to assembly 66, although its electrical connection differs as may its operation, with the latter two aspects being detailed later. Briefly noting the structural identity, assembly 68 includes a filament 78 having ends 78p and 78n and a pigtail portion 78ptl. Filament 78 is encased relative to interior area 64a by a cathode 80, where cathode 80 is a hollow container with an open end to receive filament 78 and a closed end toward interior area 64i (or again, some other configuration that protects filament 78 from exposure to the plasma). Cathode 80 includes an emitter/reflector portion 80er as well as insulating sides 80s, where each of these items is formed of like materials relative to assembly 66.

Assembly 68 is electrically connected relative to power supplies 74 and 76 in a manner differing from that of assembly 66, which is also explored in the operational discussion below. Looking now to the specific electrical connections relative to assembly 68, end 78n of filament 78 is connected to terminal $71_2$ of switch 71 and end 78p of filament 78 is connected to terminal $71_4$ of switch 71. Cathode 80 is connected to terminal $71_6$ of switch 71. Given these connections, one skilled in the art should appreciate that when switch 71 is in its downward position, then end 78p of filament 78 is electrically connected, via switch 71, to the positive terminal of filament power supply 74, end 78n of filament 78 is electrically connected, via switch 71, to the negative terminal of filament power supply 74, and cathode 80 is electrically connected, via switch 71, to the positive terminal of cathode power supply 76. However, switch 71 is in its upward position, assembly 68 is not connected to either filament power supply 74 or cathode power supply 76.

The operation of architecture 60 is now discussed in detail. Initially, switch 71 is placed in either its upward or downward position; for the sake of example, assume that switch 71 is initially placed in its upward position as shown in FIG. 5. At this point, each of power supplies 65, 74, and 76 is connected to the corresponding devices shown in FIG. 5. Thus, a bias is applied across filament 70 which thereby causes filament 70 to heat and that heat is transferred to cathode 72 and, particularly, the heat is transferred to emitter/reflector 72er. Given the material selected to form emitter/reflector 72er, at this point it operates primarily as an emitter of electrons, and those electrons are emitted into interior area 64i. Additionally, arc power supply 65 provides a bias to arc chamber 64 which relative the bias imposed on cathode 72 causes the electrons emitted from emitter/reflector 72er to travel primarily toward the center of interior area 64i. Still further, given that switch 71 is in its upward position, note at this time that emitter/reflector 80er is electrically floating; additionally, given the material selected to form emitter/reflector 80er, at this point it operates as a reflector of the electrons emitted by emitter/reflector 72er. More particularly, the floating emitter/reflector 80er develops a negative charge from the electrons initially emitted from emitter/reflector 72er, and thereafter the negative charge on emitter/reflector 80er causes additional electrons emitted from emitter/reflector 72er to return toward, and concentrate within, the center area of interior area 64i. Lastly, once a concentrated plasma is formed (e.g., also by adding gas to interior area 64i), ion beam 14 is extracted due to the potential applied by extraction power supply 26 to extraction plate 28, and ion beam 14 therefore passes through aperture 28a toward integrated circuit wafer 16.

Following the preceding operation of architecture 60, switch 71 is later placed in its downward position. At this point, arc power supply 65 continues to bias arc chamber 64, but filament power supply 74 now biases filament 78 and cathode power supply 76 now biases cathode 80. Accordingly, one skilled in the art will appreciate that electrons are now emitted and reflected in the opposite fashion as that described above with respect to switch 71 in its upward position. More particularly, when switch 71 is in its downward position, filament 78 heats which causes emitter/reflector 80er to emit electrons into interior area 64i, while emitter/reflector 72er is then initially floating and charged by electrons emitted by emitter/reflector 80er so that emitter/reflector 72er at this point serves a reflector function. Once more, therefore, ion concentration is maintained primarily in the center of interior area 64i, and these ions may be extracted in the form of ion beam 14 for implanting them (or selected ones of them) into integrated circuit wafer 16.

The alternative positions of switch 71 and the resulting operation described may be selected according to various needs. As one preferred method for such selection, in one approach switch 71 may be placed in one position (e.g., upward) and architecture 60 may thereafter operate until there is a failure of filament 70. Such a failure will be anticipated to occur over time because cathode 72, having been exposed to the plasma within interior area 64i, will eventually erode due to that exposure, and the erosion will then cause plasma to reach filament 70 so that it will eventually fail. However, continuing with the preferred method, when this failure occurs, switch 71 may be placed in the opposite position (i.e., downward) and architecture 60 is then immediately available for operation using filament 78 to emit electrons and emitter/reflector 72er as a reflector to improve central plasma concentration.

The alternatives presented in the preceding preferred methodology of moving switch 71 provide greatly improved efficiency in terms of the amount of time between required repair downtime of the ion source. Specifically, when a first filament fails, there is a very small amount of down time to switch in the manner described and then to use the second filament, where this small amount of time may be contrasted to the considerable down time required to stop operation of a prior art ion source and repair it once its filament (or one of its filaments) fails. In theory, therefore, the overall life expectancy of ion source 62 is twice that of a prior art source. As a result, a fabrication facility may be considerably more efficient in providing implanted integrated circuit wafers.

Figure 6:
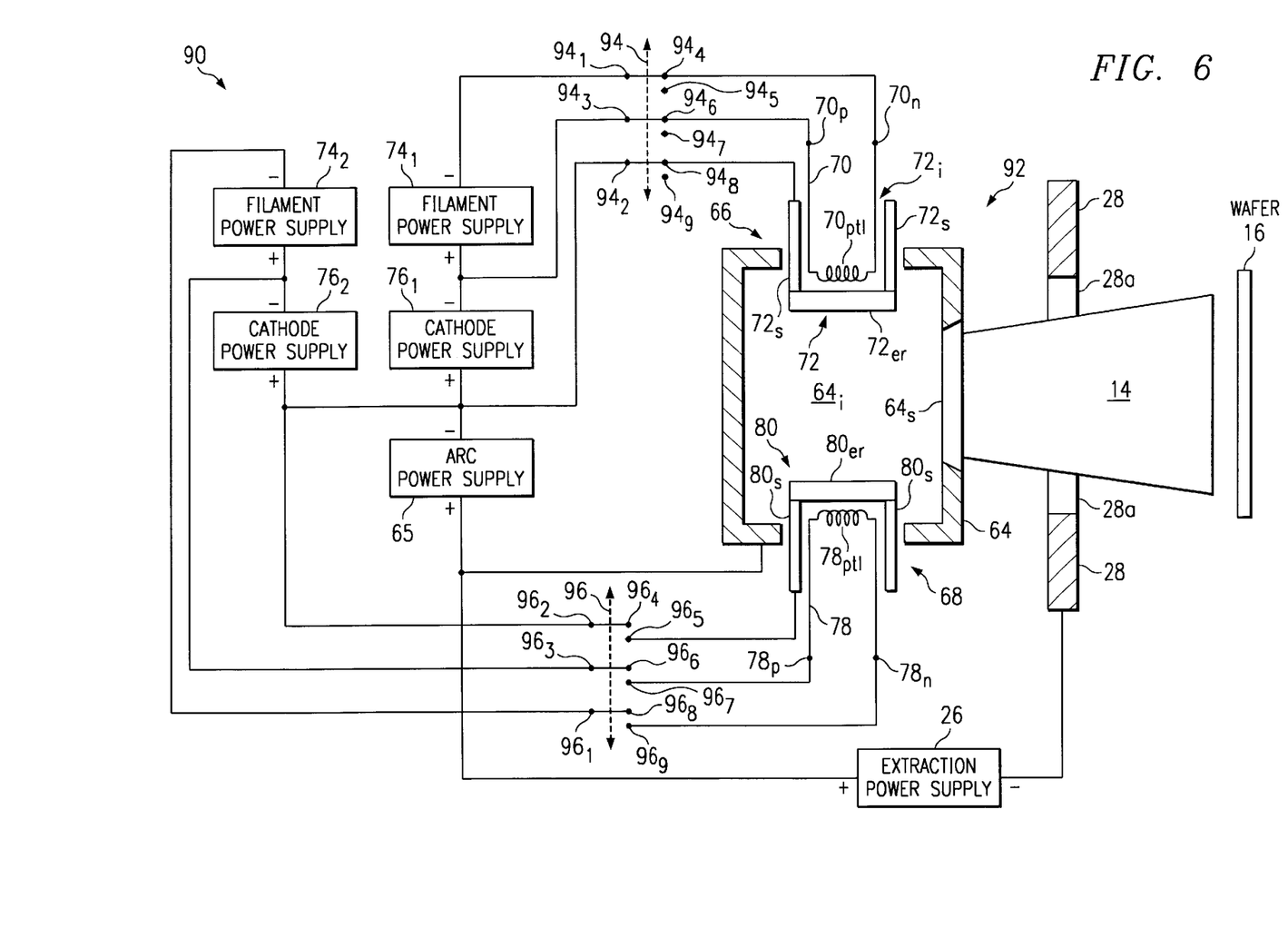
FIG. 6 illustrates a general view of a second inventive ion source architecture having an ion source with two electron source assemblies, where each assembly is operable, either alternately or concurrently, to either emit electrons or reflect electrons based on the configuration of switches connected between the assemblies and a dual set of power supplies.

FIG. 6 illustrates a second inventive ion source architecture 90. Architecture 90 shares many of the same components as architecture 60 and, thus, like reference numbers are carried forward from FIG. 5 to FIG. 6 with respect to these components. Further, architecture 90 also ultimately operates so that its ion source 92, using one of a few selected methodologies, also permits extraction of ion beam 14 via an extraction plate 28 and toward an integrated circuit wafer 16. Introducing now the differences between architectures 60 and 90, architecture 90 includes two sets of power supplies with respect to powering the filaments and cathodes of ion source 92; for purposes of comparison, these supplies use the same reference numbers as in FIG. 5, but subscripts are added to those reference numbers for further distinction. Thus, ion source 92 includes a first filament power supply $74_1$ and a second filament power supply $74_2$. Further, ion source 92 includes a first cathode power supply $76_1$ and a second cathode power supply $76_2$. In addition to having these dual supplies, the manner in which either set of supplies is connected to ion source 92 differs from the connections of filament power supply 74 and cathode power supply 76 in FIG. 5, as detailed below. Other than these supplies and their respective connections, however, ion source 92 uses the same structure as ion source 62 and, thus, the reader is assumed familiar with the earlier detail and such information is not re-stated here for the sake of simplifying the remaining discussion.

Turning first to filament power supply $74_1$ and first cathode power supply $76_1$, the negative terminal of first filament power supply $74_1$ is connected to a terminal $94_1$ of a switch 94 and the positive terminal of first cathode power supply $76_1$ is connected to a terminal $94_2$ of switch 94. The positive terminal of first filament power supply $74_1$ is connected to the negative terminal of first cathode power supply $76_1$, and these two terminals are further connected to a terminal $94_3$ of switch 94. Further with respect to switch 94, it includes six additional terminals numbered $94_4$ through $94_9$. Of these terminals, terminals $94_5$, $94_7$, and $94_9$ are not connected to any other load or connection, while terminal $94_4$ is connected to end $70n$ of filament 70, terminal $94_6$ is connected to end $70p$ of filament 70, and terminal $94_8$ is connected to cathode 72. Given the connections of switch 94, one skilled in the art should therefore appreciate that when switch 94 is in its downward position, the potentials of first filament power supply $74_1$ and first cathode power supply $76_1$ are not connected to any component of ion source 92; to the contrary, when switch 94 is in its upward position (as shown in FIG. 6), filament 70 is connected to the bias produced by first filament power supply $74_1$ while cathode 72 is connected to the bias produced by first cathode power supply $76_1$.

Turning to second filament power supply $74_2$ and second cathode power supply $76_2$, the negative terminal of second filament power supply $74_2$ is connected to a terminal $96_1$ of a switch 96 and the positive terminal of second cathode power supply $76_2$ is connected to a terminal $96_2$ of switch 96. The positive terminal of second filament power supply $74_2$ is connected to the negative terminal of second cathode power supply $76_2$, and these two terminals are further connected to a terminal $96_3$ of switch 96. Switch 96 includes six additional terminals numbered $96_4$ through $96_9$. Of these terminals, terminals $96_4$, $96_6$, and $96_8$ are not connected to any other load or connection, while terminal $96_5$ is connected to cathode 80, terminal $96_7$ is connected to end $78p$ of filament 78, and terminal $96_9$ is connected to end $78n$ of filament 78. Given the connections of switch 96, one skilled in the art should therefore appreciate that when switch 94 is in its upward position (as shown in FIG. 6), the potentials of second filament power supply $74_2$ and second cathode power supply $76_2$ are not connected to any component of ion source 92; to the contrary, when switch 96 is in its downward position, filament 78 is connected to the bias produced by second filament power supply $74_2$ while cathode 80 is connected to the bias produced be biased by second cathode power supply $76_2$.

Architecture 90 may operate according to various different methods, where the selection of a particular method is made according to the positions of switches 94 and 96. In a first method, assemblies 66 and 68 are enabled alternately in a manner comparable in various respects to architecture 60 of FIG. 5. In a second method, assemblies 66 and 68 are enabled concurrently. Each of these two methods is explored in greater detail below.

In a first method of operating architecture 90, switches 94 and 96 are placed in a same position thereby enabling one of assemblies 66 and 68 to supply ions, while the non-activated one of assemblies 66 and 68 operates to reflect ions. For example, assume that switches 94 and 96 are placed in a same upward position. From the earlier discussion of the connections to these switches, one skilled in the art will appreciate that the upward positioning of switch 94 enables assembly 66 by connecting first filament power supply $74_1$ to filament 70 and first cathode power supply $76_1$ to cathode 72. Consequently, filament 70 heats and thereby transfers heat to emitter/reflector 72er, which in response emits electrons into interior area 64i. In addition, the upward position of switch 96 causes assembly 68 to electrically float. As a result, filament 78 is not heated by an electrical bias and emitter/reflector 80er accumulates charge from electrons emitted by emitter/reflector 72er and, thereafter, reflects additional electrons toward the center of interior area 64i. Also in this first method, switches 94 and 96 may be placed in a same downward position. In response, assemblies 66 and 68 are connected in a manner opposite of that described when switches 94 and 96 are in the upward position. Briefly, therefore, when switches 94 and 96 are in downward positions, assembly 68 is electrically enabled so that filament 78 heats and emitter/reflector 80er emits electrons into interior area 64i, while assembly 66 electrically floats and, thus, after some initial charging, emitter/reflector 72er reflects electrons toward the center of interior area 64i. As with architecture 60, this first method of operation of architecture 90 may be used in a manner whereby in a first instance one assembly is energized until its filament fails, followed by a second instance where the opposing assembly is energized until its filament fails. Once more, therefore, the amount of time between significant downtime should be considerably increased over the prior art and, indeed, may be on the order of twice that of the prior art.

In a second method of operating architecture 90, switches 94 and 96 are placed in a opposite positions. For example, if switch 94 is upward and switch 92 is downward, then both of assemblies 68 and 92 are disabled, as is useful when it is desired to turn off the ion source. As another example, if switch 94 is downward and switch 92 is upward, both of assemblies 68 and 92 are enabled. When assemblies 68 and 92 are both enabled, then each of filaments 70 and 78 heats, and each of emitter/reflectors 72er and 80er emits electrons. In this manner, therefore, the plasma density in interior area 64i is increased relative to that which is achieved using only one assembly. As a result, higher beam currents may be extracted from ion source 92.

From the above, it may be appreciated that the above embodiments provide numerous distinctions and benefits over the prior art. For example, relative to all of the prior art embodiments described earlier, the present embodiments greatly extend the operational time between time periods required for filament replacement or the like. As another example relative to architectures 10, 30, and 50, the present embodiments do not expose the filaments directly to plasma. As another example relative to architecture 40, the present embodiments achieve an electron reflective functionality using only electron source assemblies, and do not require the additional hardware and complexity of a separate reflector. As another example, the present embodiments permit an architecture having multiple filaments and a method of operation whereby less than all of the filaments are operated at a time; indeed, in this regard, note that the preferred embodiment has been shown with two filaments (and corresponding emitter/reflectors), but many of the present teachings may apply to a configuration with more than two filaments. As still another example relative to all of the prior art embodiments described earlier, architecture 90 provides different methods of operation, where each of the prior art architectures contemplate only a single method of operation. As a final example, while the present embodiments have been described in detail, various substitutions, modifications or alterations could be made to the descriptions set forth above without departing from the inventive scope; for example, while architecture 90 illustrates how dual power supplies may be used to provide for different operating methods, the single power supply example of architecture 60 could be used in connection with alternative switching configurations to also provide for either alternating or concurrent operation of the source filaments (assuming sufficient power availability from the single power supplies). Still other examples will be ascertainable by one skilled in the art, and such a person should therefore readily appreciate the inventive scope as defined by the following claims.

What is claimed is:

1. An ion implanting architecture, comprising:
   an arc chamber having an interior area;
   a plurality of electron sources disposed at least partially within the interior area; and
   wherein the plurality of sources each comprise:
      a conductive plate operable to emit electrons into the interior area; and
      a heating element for transferring heat to the conductive plate.

2. The ion implanting architecture of claim 1:
   wherein a plasma is formed within the interior area; and
   wherein, for the plurality of electron sources, the conductive plate is part of a structure that protects the heating element from exposure to the plasma.

3. The ion implanting architecture of claim 2 wherein, for the plurality of electron sources, the structure comprises a container having an open end and a closed end, wherein the heating element is disposed within the open and the closed end is disposed within the interior area.

4. The ion implanting architecture of claim 1 wherein, for the plurality of electron sources, the conductive plate comprises a metal.

5. The ion implanting architecture of claim 1 wherein the plurality of electron sources comprise a first electron source and a second electron source.

6. The ion implanting architecture of claim 5 and further comprising:
   at least one heating element power supply;
   at least one conductive plate power supply;
   switching circuitry;
      wherein the switching circuitry is for selectively coupling at a first time the heating element of the first electron source to the at least one heating element power supply and the conductive plate of the first electron source to the at least one conductive plate power supply; and
      wherein the switching circuitry is for selectively coupling at a second time the heating element of the second electron source to the at least one heating element power supply and the conductive plate of the second electron source to the at least one conductive plate power supply.

7. The ion implanting architecture of claim 6 wherein the first time does not overlap the second time.

8. The ion implanting architecture of claim 6 wherein:
   during the first time, the heating element of the second electron source and the conductive plate of the second electron source are electrically disconnected from a power supply, and the conductive plate of the second electron source is for reflecting electrons toward the interior area; and
   during the second time, the heating element of the first electron source and the conductive plate of the first electron source are electrically disconnected from a power supply, and the conductive plate of the first electron source is for reflecting electrons toward the interior area.

9. The ion implanting architecture of claim 6:
   wherein the at least one heating element power supply consists of a single heating element power supply; and
   wherein the at least one conductive plate power supply consists of a single conductive plate power supply.

10. The ion implanting architecture of claim 6:
    wherein the first time does not overlap the second time;
    wherein, during the first time, the heating element of the second electron source and the conductive plate of the second electron source are electrically disconnected from a power supply, and the conductive plate of the second electron source is for reflecting electrons toward the interior area;
    wherein, during the second time, the heating element of the first electron source and the conductive plate of the first electron source are electrically disconnected from a power supply, and the conductive plate of the first electron source is for reflecting electrons toward the interior area;
    wherein the at least one heating element power supply consists of a single heating element power supply; and
    wherein the at least one conductive plate power supply consists of a single conductive plate power supply.

11. The ion implanting architecture of claim 6 wherein the first time overlaps the second time.

12. The ion implanting architecture of claim 11:
    wherein the at least one heating element power supply comprises a first heating element power supply for providing power to the heating element of the first electron source and a second heating element power supply for providing power to the heating element of the second electron source; and
    wherein the at least one conductive plate power supply comprises a first conductive plate power supply for providing power to the conductive plate of the first electron source and a second conductive plate power supply for providing power to the conductive plate of the second electron source.

13. The ion implanting architecture of claim 5:
wherein the first electron source is disposed in a first side of the arc chamber;
wherein the second electron source is disposed in a second side of the arc chamber; and
wherein the first side is opposite the second side.

14. The ion implanting architecture of claim 1 wherein, for the first electron source and the second electron source, the heating element comprises a filament.

15. The ion implanting architecture of claim 14 wherein the filament comprises a pigtail portion.

16. An ion implanting architecture, comprising:
an arc chamber having an interior area;
a plurality of electron sources disposed at least partially within the interior area; and
wherein the plurality of sources each comprise:
    a conductive plate operable to emit electrons into the interior area; and
    a heating element for transferring heat to the conductive plate;
wherein a plasma is formed within the interior area;
wherein, for the plurality of electron sources, the conductive plate is part of a structure that protects the heating element from exposure to the plasma; and
wherein, for the plurality of electron sources, the conductive plate comprises a metal.

17. The ion implanting architecture of claim 16 wherein the plurality of electron sources comprise a first electron source and a second electron source, and further comprising:
at least one heating element power supply;
at least one conductive plate power supply;
switching circuitry;
    wherein the switching circuitry is for selectively coupling at a first time the heating element of the first electron source to the at least one heating element power supply and the conductive plate of the first electron source to the at least one conductive plate power supply; and
    wherein the switching circuitry is for selectively coupling at a second time the heating element of the second electron source to the at least one heating element power supply and the conductive plate of the second electron source to the at least one conductive plate power supply; and
    wherein the first time does not overlap the second time.

18. The ion implanting architecture of claim 17 wherein:
during the first time, the heating element of the second electron source and the conductive plate of the second electron source are electrically disconnected from a power supply, and the conductive plate of the second electron source is for reflecting electrons toward the interior area; and
during the second time, the heating element of the first electron source and the conductive plate of the first electron source are electrically disconnected from a power supply, and the conductive plate of the first electron source is for reflecting electrons toward the interior area.

19. The ion implanting architecture of claim 18 wherein the plurality of electron sources comprise a first electron source and a second electron source, and further comprising:
at least one heating element power supply;
at least one conductive plate power supply;
switching circuitry;
    wherein the switching circuitry is for selectively coupling at a first time the heating element of the first electron source to the at least one heating element power supply and the conductive plate of the first electron source to the at least one conductive plate power supply; and
    wherein the switching circuitry is for selectively coupling at a second time the heating element of the second electron source to the at least one heating element power supply and the conductive plate of the second electron source to the at least one conductive plate power supply; and
    wherein the first time overlaps the second time.

20. The ion implanting architecture of claim 19:
wherein the at least one heating element power supply comprises a first heating element power supply for providing power to the heating element of the first electron source and a second heating element power supply for providing power to the heating element of the second electron source; and
wherein the at least one conductive plate power supply comprises a first conductive plate power supply for providing power to the conductive plate of the first electron source and a second conductive plate power supply for providing power to the conductive plate of the second electron source.

21. A method of operating an ion implanting architecture, the architecture comprising an arc chamber having an interior area and a plurality of electron sources disposed at least partially within the interior area, the method comprising the steps of:
at a first time, supplying power to a heating element of a first electron source in the plurality of electron sources whereby in response to the power the heating element of the first electron source transfers heat to a conductive plate of the first electron source and whereby in response to the transferred heat the conductive plate of the first electron source emits electrons into the interior area;
at a second time different than the first time, supplying power to a heating element of a second electron source in the plurality of electron sources whereby in response to the power the heating element of the second electron source transfers heat to a conductive plate of the second electron source and whereby in response to the transferred heat the conductive plate of the second electron source emits electrons into the interior area;
wherein during the first time the conductive plate of the second electron source reflects electrons emitted from the conductive plate of the first electron source; and
wherein during the second time the conductive plate of the first electron source reflects electrons emitted from the conductive plate of the second electron source.

22. The method of claim 21:
wherein during the first time the conductive plate of the second electron source is not connected to a power supply; and
wherein during the second time the conductive plate of the first electron source is not connected to a power supply.

* * * * *